United States Patent
Liao et al.

(10) Patent No.: US 10,879,098 B2
(45) Date of Patent: Dec. 29, 2020

(54) SEMICONDUCTOR CHIP HOLDER

(71) Applicant: Taiwan Semiconductor Manufacturing Co., Ltd., Hsinchu (TW)

(72) Inventors: Tsung-Jen Liao, Hsinchu (TW); Pei-Haw Tsao, Tai-chung (TW); Tsui-Mei Chen, Hsinchu (TW); Yu-Jung Lin, Hsinchu (TW); Ju-Min Chen, Hsinchu (TW); Sean Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 64 days.

(21) Appl. No.: 16/134,448

(22) Filed: Sep. 18, 2018

(65) Prior Publication Data
US 2020/0090970 A1    Mar. 19, 2020

(51) Int. Cl.
*H01L 21/673*      (2006.01)

(52) U.S. Cl.
CPC .. *H01L 21/67356* (2013.01); *H01L 21/67376* (2013.01); *H01L 21/67386* (2013.01)

(58) Field of Classification Search
CPC ......... H01L 21/67376; H01L 21/67379; H01L 21/67386; H01L 21/67356; H01L 21/673
USPC ....... 206/714, 701, 713, 706, 707, 715, 716, 206/728, 1.5, 708, 717; 383/210, 61.2
See application file for complete search history.

(56) References Cited

U.S. PATENT DOCUMENTS

| | | | | |
|---|---|---|---|---|
| 4,708,245 A * | 11/1987 | Boeckmann | ........... | B65D 73/02 206/714 |
| 5,499,717 A * | 3/1996 | Hayashi | ................. | B65D 73/02 206/390 |
| 6,484,881 B1 * | 11/2002 | Alvite | .................... | B65D 73/02 206/714 |
| 6,491,185 B1 * | 12/2002 | Azzarello | .......... | B65D 43/0206 206/508 |
| 2006/0034551 A1 * | 2/2006 | Linneweil | .............. | B65D 31/10 383/61.2 |
| 2008/0087572 A1 * | 4/2008 | Wihren | .............. | H05K 13/0084 206/714 |
| 2008/0296201 A1 * | 12/2008 | Lalouch | ............. | H05K 13/0084 206/714 |

FOREIGN PATENT DOCUMENTS

JP     8-324678 A    12/1996

OTHER PUBLICATIONS

Taiwanese Office Action, dated Jul. 17, 2019, for Taiwanese Application No. 10820663540, 6 pages.

* cited by examiner

*Primary Examiner* — Rafael A Ortiz
(74) *Attorney, Agent, or Firm* — Seed IP Law Group LLP (57) ABSTRACT

The various embodiments provide a semiconductor chip holder that holds semiconductor chips. The chip holder protects the semiconductor chips from possible damage during transport and/or storage. The chip holder is flexible and may be wound around a reel for convenient transport and storage. In one embodiment, the chip holder includes a support substrate with receptacles that receive semiconductor chips, a cover layer that seals the receptacles and holds the semiconductor chips within the receptacles, and plugs to securely couple the support substrate and the cover layer together.

18 Claims, 7 Drawing Sheets

SEMICONDUCTOR CHIP HOLDER

BACKGROUND

Many devices, such as laptops, smart phones, and tablets, utilize semiconductor chips with small footprints in order to maximize the amount of chips that may be included in the devices and to minimize the overall size and weight of the devices. For example, wafer level chip scale packages (WLCSP) are often used for mobile device as WLCSP are small in size (e.g., a reduced footprint, thickness, and weight) compared to other types of semiconductor chips, and can be directly mounted on a printed circuit board (PCB).

Due to their small size, semiconductor chips are fragile and are often damaged during transport from semiconductor manufacturers to device manufacturers. Damage to the semiconductor chips during transport is undesirable as many manufacturers, such as mobile device manufacturers and automotive device manufacturers, demand parts to be delivered with very few, if any, defective parts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed above, semiconductor chips are often damaged during transport from semiconductor manufacturers to device manufacturers due to their small size. In order to minimize the number of semiconductor chips that are damaged during transport, chips are often transported using tape and reel packaging methods. Tape and reel packaging methods typically include placing semiconductor chips on a carrier tape, sealing the semiconductor chips on the carrier tape with an adhesive cover tape, and winding the carrier tape with adhesive cover tape around a reel for transport.

Current tape and reel packing methods, however, have several drawbacks. For example, as the adhesive cover tape includes an adhesive layer, the semiconductor chips will often unintentionally stick to the adhesive cover tape itself. Consequently, the semiconductor chips cannot be removed from the carrier tape in the normal manner which affects subsequent processing steps, or the semiconductor chips become damaged when attempting to remove the chips from the adhesive cover tape. Further, the carrier tape and the adhesive cover tape are typically used once and then disposed of. Namely, once the semiconductor chips are delivered to their desired destination, the carrier tape and the adhesive cover tape are discarded. The carrier tape and the adhesive cover tape are not reused because the carrier tape often becomes damaged from the adhesive cover tape being removed from the carrier tape. Further, the adhesive cover tape often loses its adhesive properties after a single use (i.e., stuck to and removed from the carrier tape). Consequently, current tape and reel packing methods often result in wasted materials, and, thus, generally have high associated costs. In addition, current adhesive cover tapes generally include multiple layers (e.g., an adhesive layer, a support layer, and/or a coating film). As a result, attaching the adhesive cover tape to the carrier tape greatly increases the overall thickness of the carrier tape, and, thus, limits the number of semiconductor chips that may be included in a single reel.

Figure 1:
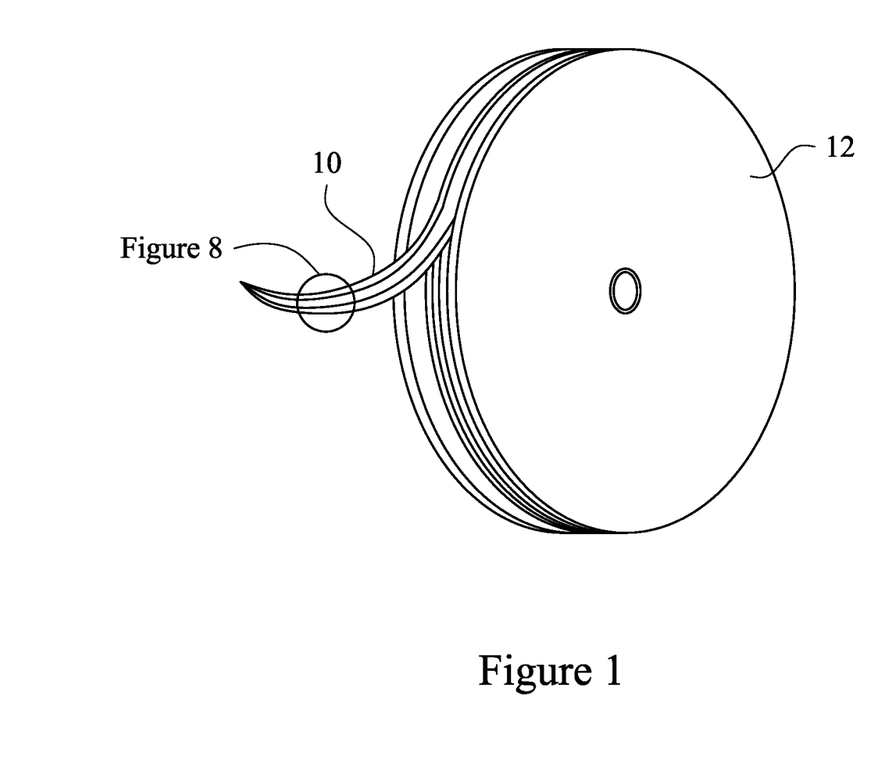
FIG. 1 is a chip holder wound around a reel in accordance with some embodiments.

The present disclosure is directed to embodiments of a semiconductor chip holder for holding and protecting semiconductor chips during transport and/or storage. FIG. 1 is a semiconductor chip holder 10 wound around a reel 12 in accordance with some embodiments.

The chip holder 10 holds semiconductor chips and protects the semiconductor chips from damage. The chip holder 10 is capable of holding numerous semiconductor chips (e.g., up to 4000 semiconductor chips or more). In one embodiment, the chip holder 10 is flexible. Thus, as shown in FIG. 1, the chip holder 10 may be wound around the reel 12 for transport and/or storage. By winding the chip holder 10 around the reel 12, numerous semiconductor chips may be conveniently packed together in a single, compact package. It is noted, however, that the chip holder 10 may also be inflexible (i.e., rigid) in some embodiments, in which case the chip holder 10 may not be wound around a reel.

The chip holder 10 includes a support substrate with receptacles that receive semiconductor chips, a cover layer that seals the receptacles and retains the semiconductor chips within the receptacles, and plugs to securely couple the support substrate and the cover layer together. The assembling of the chip holder 10 will be discussed in further detail with respect to FIGS. 2 through 9.

Figure 2:
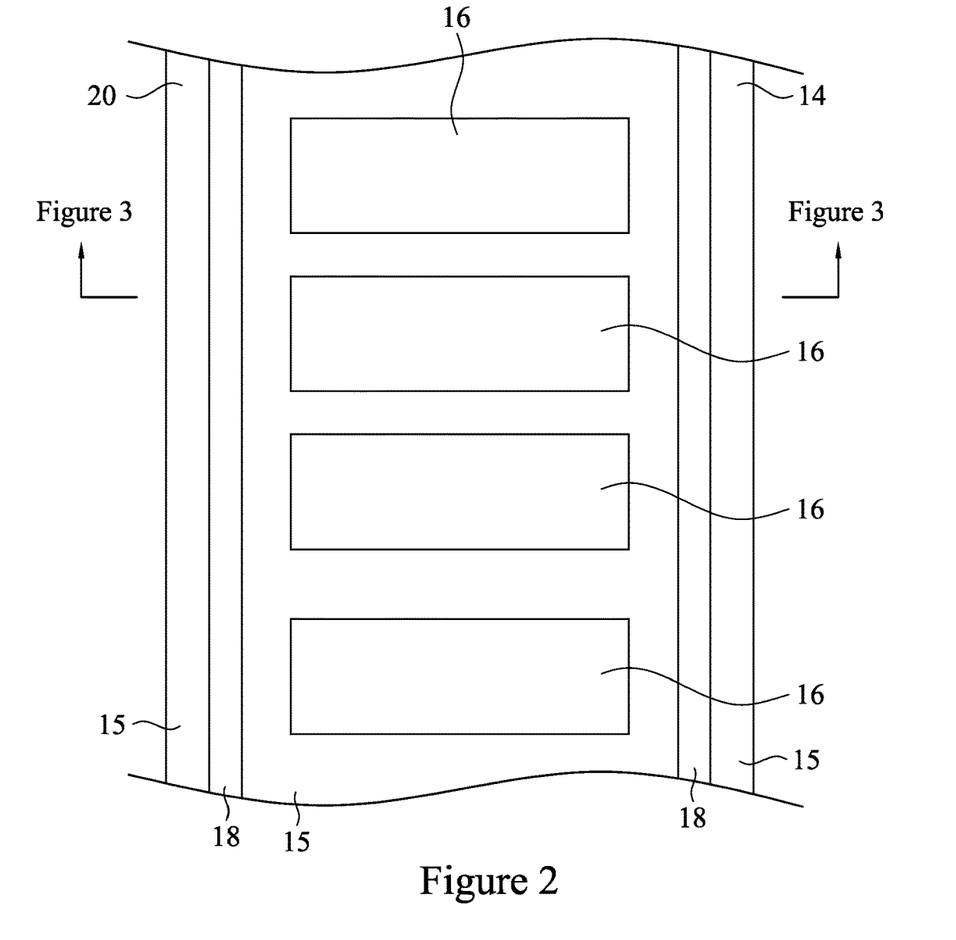
FIG. 2 is a top view of a support substrate in accordance with some embodiments.
Figure 3:
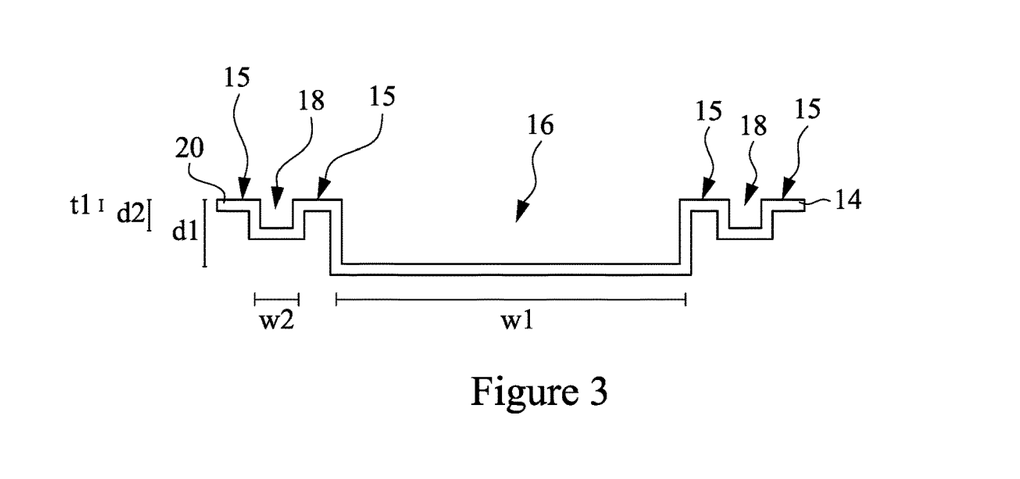
FIG. 3 is a cross-sectional view of a support substrate, along the axis shown in FIG. 2 in accordance with some embodiments.

FIG. 2 is a top view of a support substrate 14 in accordance with some embodiments. FIG. 3 is a cross-sectional view of the support substrate 14, along the axis shown in FIG. 2 in accordance with some embodiments. It is beneficial to review FIGS. 2 and 3 together. It is noted that FIG. 2 shows just a portion of the support substrate 14.

The support substrate 14 is a base layer of the chip holder 10. The support substrate 14 provides a support or carrier for semiconductor chips. As will be discussed in further detail with respect to FIGS. 6 and 7, in one embodiment, surfaces 15 (i.e., the upper surfaces as shown in FIGS. 2 and 3) of the support substrate 14 are substantially coplanar with each other. The support substrate 14 includes receptacles 16 and channels 18.

In one embodiment, the support substrate 14 extends for the entire length (i.e., the longest dimension) of the chip holder 10. Stated differently, the support substrate 14 extends from a first end of the chip holder 10; along the length of the chip holder 10; and to a second end, opposite to the first end, of the chip holder 10.

In one embodiment, the support substrate 14 is a single contiguous piece. In one embodiment, the support substrate 14 is made of a plastic material. For example, in one embodiment, the support substrate 14 is made of polycarbonate, polyethylene terephthalate, polypropylene, polystyrene, polyvinyl chloride, or combinations thereof.

The receptacles 16 are cavities within the support substrate 14. As will be discussed in further detail with respect to FIGS. 4 and 5, the receptacles 16 are configured to receive and hold semiconductor chips. Each of the receptacles 16 is large enough to accommodate a desired semiconductor chip. For example, each of the receptacles 16 has a depth, width, and length such that a semiconductor chip within a receptacle is completely contained within the receptacle. It is noted that, although four receptacles 16 are shown in FIG. 2, FIG. 2 shows just a portion of the support substrate 14 and the support substrate 14 may include any number of receptacles.

In one embodiment, the receptacles 16 are positioned such that the receptacles 16 are aligned with each other. For example, as shown in FIG. 2, the receptacles 16 are aligned in a single column. Other arrangements are also possible. For example, in one embodiment, the support substrate 14 includes receptacles that are arranged in an array that includes a plurality of columns and rows.

In one embodiment, as shown in FIG. 2, all of the receptacles 16 are the same size to accommodate semiconductor chips with a single size. In one embodiment, the receptacles 16 have different sizes. For example, in one embodiment, the receptacles 16 have at least two different sizes in order to accommodate at least two different sized semiconductor chips.

In one embodiment, each of the receptacles 16 has a shape to accommodate a desired semiconductor chip. For example, as best shown in FIG. 2, each of the receptacles 16 has a rectangular shape in order to accommodate a rectangular semiconductor chip. Other shapes are possible. For example, in one embodiment, one or more of the receptacles 16 is square or circular in shape in order to accommodate a square or circular semiconductor chips.

The channels 18 are elongated cavities within the support substrate 14. As will be discussed in further detail with respect to FIGS. 6 to 9, the channels 18 are configured to receive plugs. The plugs are inserted into the channels 18 in order to secure or attach a cover layer to the support substrate 14.

In one embodiment, the channels 18 extend along the length (i.e., the longest dimension) of the support substrate 14. For example, as best shown in FIG. 2, the channels 18 extend in a vertical direction, along the sides of the support substrate 14.

In one embodiment, the channels 18 extend along the entire length of the support substrate 14. Namely, the channels 18 extend from a first end of the support substrate 14, along the of the support substrate 14, and to a second end, opposite to the first end, of the support substrate 14. In other embodiments, multiple channels 18 are provided in the support substrate 14; however, none of these multiple channels extends the entire length of the support substrate 14. For example, a support substrate 14 can include three channels 18, none of which individually extend the entire length of support substrate, but the combination of the three channels 18 occupies substantially the entire length of the support substrate 14.

In one embodiment, as shown in FIGS. 2 and 3, the support substrate 14 includes two channels, and the two channels are positioned on opposite sides of the receptacles 16. Stated differently, the receptacles 16 are positioned between two channels such that the channels 18 are spaced from each other by the receptacles 16.

In one embodiment, the channels 18 have a depth that is equal to or smaller than a depth of the receptacles 16. For example, as shown in FIG. 3, each of the receptacles 16 has a depth $d_1$, and each of the channels 18 has a depth $d_2$ that is smaller than the depth $d_1$. In one embodiment, the depth $d_1$ is between 2 to 10 millimeters. In one embodiment, the depth $d_2$ is between 1 and 5 millimeters. Depths $d_1$ and $d_2$ are not limited to the foregoing depths and in other embodiments may be deeper or shallower than the examples given above. By having the depth of the channels 18 equal to or smaller than the depth of the receptacles 16, the thickness of the support substrate 14, and thus the chip holder 10, may be minimized. That is, the thickness of support substrate 14 will be set by the depth of the receptacles 16, not by the depth of the channels 18. In addition, using a smaller depth for the channels 18 reduces the amount of material that is used to fabricate the support substrate 14 and, thus, reduces fabrication costs.

In one embodiment, the channels 18 have a smaller width than the receptacles 16. For example, as shown in FIG. 3, each of the receptacles 16 has a width w1, and each of the channels 18 has a width w2 that is smaller than the width w1. In one embodiment the width w1 is between 10 and 50 millimeters. In one embodiment, the width w2 is between 1 and 5 millimeters. Widths w1 and w2 are not limited to the foregoing widths and in other embodiments may be wider or narrower than the examples given above. By using a smaller width for the channels 18, the size of the receptacles 16 may be maximized. Stated differently, the majority of the area of the support substrate 14 may be used for the receptacles 16. As a result, the receptacles 16 are able to accommodate larger semiconductor chips.

As previously discussed, in one embodiment, the chip holder 10 is flexible. As a result, the chip holder 10 may be easily wound around the reel 12 for transport and/or storage. In order to improve the flexibility of the chip holder 10, in one embodiment, the support substrate 14 is embossed in a single layer of material, such as plastic. For example, as best shown in FIG. 3, the support substrate 14 is fabricated by molding or stamping a layer 20 of plastic material to form the receptacles 16 and the channels 18. It is noted, however, that other processes may be used to fabricate the support substrate 14.

To further improve the flexibility of the chip holder 10, in one embodiment, the layer 20 has a thickness t1 that is very thin. In one embodiment, the thickness t1 is between 1 and 2 millimeters. In other embodiments, thickness t1 is less than 1 millimeter or greater than 2 millimeters. Using a thin layer 20 for the support substrate 14 also reduces the amount of material that is used to fabricate the support substrate 14 and, thus, reduces fabrication costs.

Figure 4:
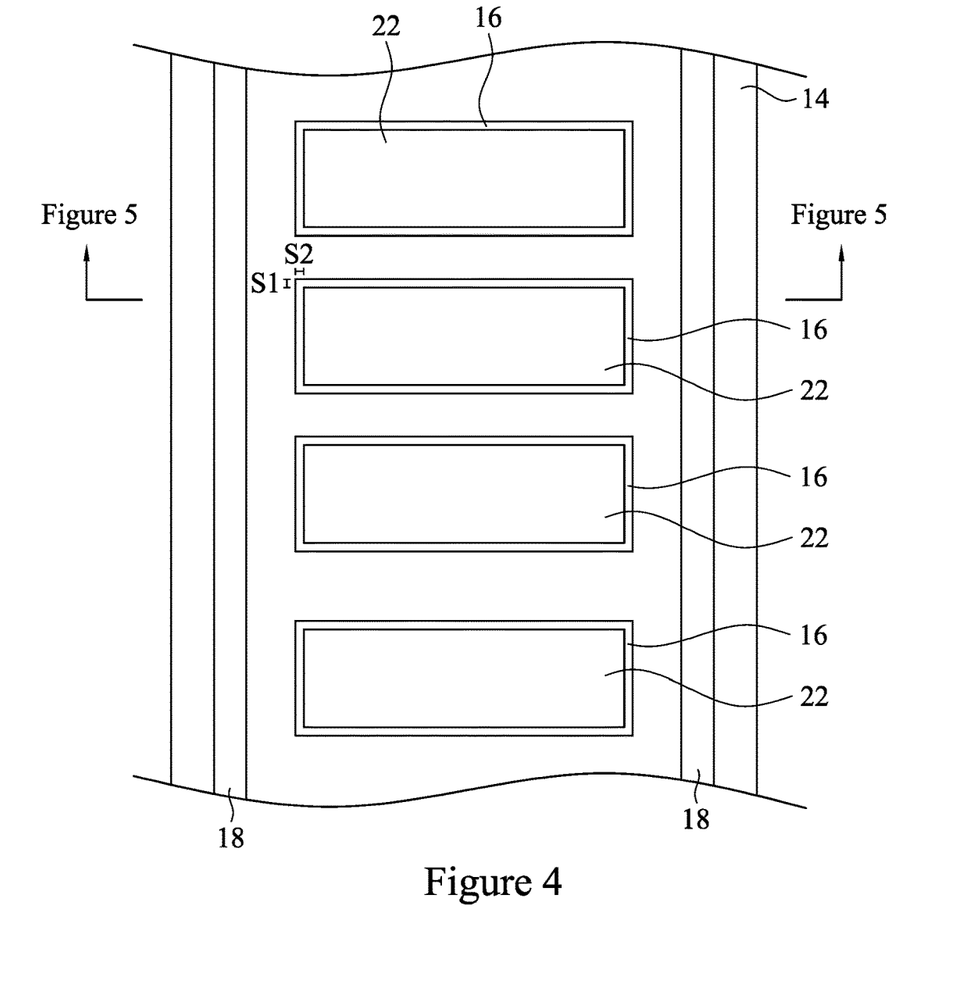
FIG. 4 is a top view of a support substrate with semiconductor chips placed in receptacles in accordance with some embodiments.
Figure 5:
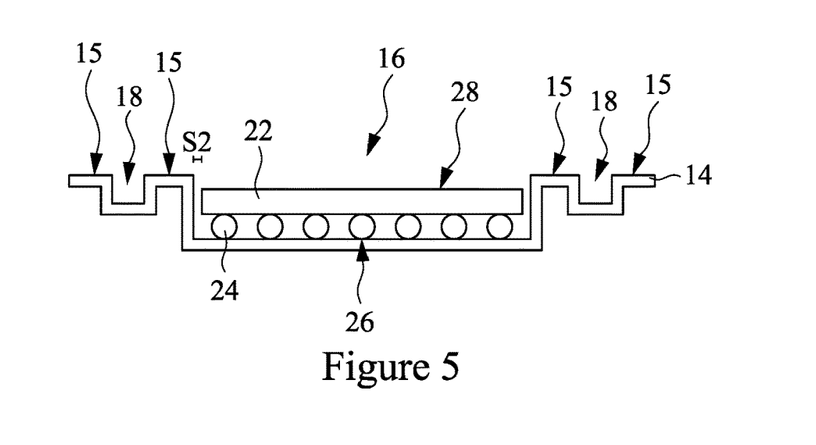
FIG. 5 is a cross-sectional view of a support substrate with semiconductor chips placed in receptacles, along the axis shown in FIG. 4 in accordance with some embodiments.

Once the support substrate 14 is fabricated, semiconductor chips are loaded on to the support substrate 14. FIG. 4 is a top view of the support substrate 14 with semiconductor chips 22 placed in receptacles 16 in accordance with some embodiments. FIG. 5 is a cross-sectional view, of the support substrate 14 with semiconductor chips 22 placed in receptacles 16, along the axis shown in FIG. 4 in accordance with some embodiments. It is beneficial to review FIGS. 4 and 5 together.

The semiconductor chips 22 are loaded on to the support substrate 14 by placing the semiconductor chips 22 into the receptacles 16. In the embodiment shown in FIGS. 4 and 5, the semiconductor chips 22 are wafer level chip scale packages (WLCSP) with solder balls 24. It is noted, however, any type of semiconductor chips may be loaded on to the support substrate 14.

In one embodiment, in order to protect fragile components of the semiconductor chips 22, the semiconductor chips 22 are positioned in the receptacles 16 such that the most fragile side of the semiconductor chips 22 are positioned on the bases of the receptacles 16. For example, as best shown in FIG. 5, a side 26 of the semiconductor chip 22 with the solder balls 24 is facing the base of the receptacle 16 as the side 26 is more fragile than a side 28 of the semiconductor chip 22.

In one embodiment, a single semiconductor chip is placed into each of the receptacles 16. For example, as best shown in FIG. 4, each of the semiconductor chips 22 is positioned in its own receptacle 16. As a result, a semiconductor chip will not be damaged from contact with other semiconductor chips during transport.

As previously discussed, each of the receptacles 16 is sized to accommodate a desired semiconductor chip. In one embodiment, each of the receptacles 16 has a depth, width, and length such that a semiconductor chip within a receptacle is completely contained within the receptacle. For example, as best shown in FIG. 5, the semiconductor chip 22 does not extend outside of the receptacle 16 (i.e., above upper surfaces 15 of the support substrate 14).

In one embodiment, the receptacles 16 are sized such that the sidewalls of the receptacles 16 are immediately adjacent to the semiconductor chips 22. For example, as shown in FIGS. 4 and 5, the sidewalls of the receptacles 16 are spaced from the semiconductor chips 22 by a distances s1 and s2. In one embodiment, the distances s1 and s2 are between 0.1 to 1 millimeters. In other embodiments s1 and s2 are less than 0.1 millimeters or greater than 1.0 millimeters. Having the sidewalls of the receptacles 16 immediately adjacent to the semiconductor chips 22 minimizes or prevents movement of the semiconductor chips 22 in the receptacles 16 during transport, which can result in damage to the semiconductor chips 22.

Figure 6:
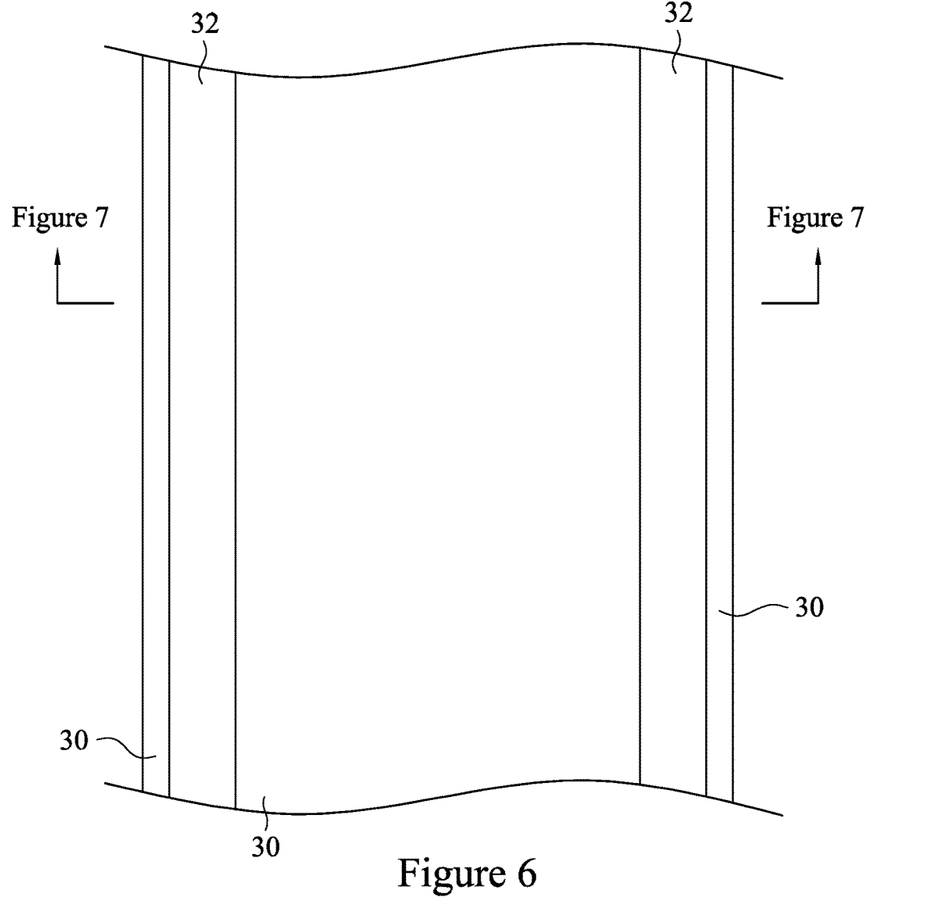
FIG. 6 is a top view of a cover layer on a support substrate with semiconductor chips placed in receptacles in accordance with some embodiments.
Figure 7:
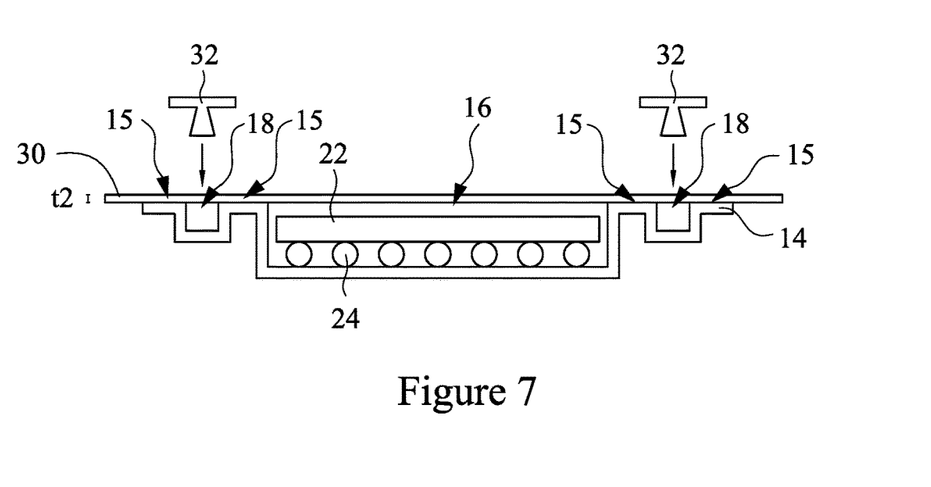
FIG. 7 is a cross-sectional view of a cover layer on a support substrate with semiconductor chips placed in receptacles, along the axis shown in FIG. 6 in accordance with some embodiments.

After the semiconductor chips 22 are loaded on to the support substrate 14, a cover layer is positioned over support substrate 14. FIG. 6 is a top view of a cover layer 30 on the support substrate 14 with the semiconductor chips 22 placed in receptacles 16 in accordance with some embodiments. FIG. 7 is a cross-sectional view, of the cover layer 30 on the support substrate 14 with semiconductor chips 22 placed in receptacles, along the axis shown in FIG. 6 in accordance with some embodiments. It is beneficial to review FIGS. 6 and 7 together.

The cover layer 30 is positioned on the support substrate 14. In particular, the cover layer 30 is overlaid on the upper surface of the support substrate 14 to cover and enclose the receptacles 16 and the channels 18. The cover layer 30 is used to seal the receptacles and hold the semiconductor chips 22 within the receptacles 16. In other embodiments, the cover layer 30 is over the upper surface of the support substrate 14, but is not in physical contact with the upper surface of the support substrate 14, for example, when another layer of material is interposed between the cover layer 30 and upper surface of the support substrate 14.

Similar to the support substrate 14, in one embodiment, the cover layer 30 extends for the entire length (i.e., the longest dimension) of the chip holder 10. That is, the cover layer 30 extends from a first end of the chip holder 10; along the length of the chip holder 10; and to a second end, opposite to the first end, of the chip holder 10. In other embodiments, cover layer 30 extends for less than the entire length of the chip holder 10, e.g., when the support substrate 14 is covered by multiple pieces of cover layer 30.

In one embodiment, the cover layer 30 is a single, contiguous layer. In one embodiment, the cover layer 30 is made of a plastic material. For example, the cover layer 30 is made from a polycarbonate, polyethylene terephthalate, polypropylene, polystyrene, or polyvinyl chloride material, or combinations thereof.

As previously discussed, in one embodiment, the surfaces 15 of the support substrate 14 are substantially coplanar with each other. The substantially coplanar surfaces 15 provides a substantially planar surface for the cover layer 30 such that the cover layer 30 lays flat when positioned over the support substrate 14. As a result, the cover layer 30 does not unnecessarily increase the overall thickness of the chip holder 10.

As discussed above, in one embodiment, the chip holder 10 is flexible. Thus, the chip holder 10 may be easily wound around the reel 12 for transport and/or storage. In order to improve the flexibility of the chip holder 10, in one embodiment, the cover layer 30 has a thin thickness t2 such that the cover layer 30 may easily bend. In one embodiment, the thickness t2 is between 0.1 to 1 millimeters. In other embodiments, thickness t2 is less than 0.1 millimeters or greater than 1.0 millimeters. In addition, the thin cover layer 30 will not unnecessarily increase the overall thickness of the chip holder 10. Also, using a thin cover layer 30 reduces fabrication costs by reducing the amount of material that is used to fabricate the cover layer 30.

In one embodiment, the cover layer 30 is a non-adhesive layer. Stated differently, the cover layer 30 does not include any adhesive to adhere the cover layer 30 to the support substrate 14. Instead, the cover layer 30 is secured to the support substrate 14 with mechanical fasteners or plugs 32. As best shown in FIG. 7, the plugs 32 are aligned with the channels 18 (i.e., positioned directly above the channels 18) such that support substrate 14 and the plugs 32 are separated from each other by the cover layer 30. In accordance with embodiments described herein, the plugs 32 are inserted into the channels 18 to force portions of the cover layer 30 into the channels 18. By pushing portions of the cover layer 30 into the channels 18 with the plugs 32, the cover layer 30 is held securely to the support substrate 14.

Figure 8:
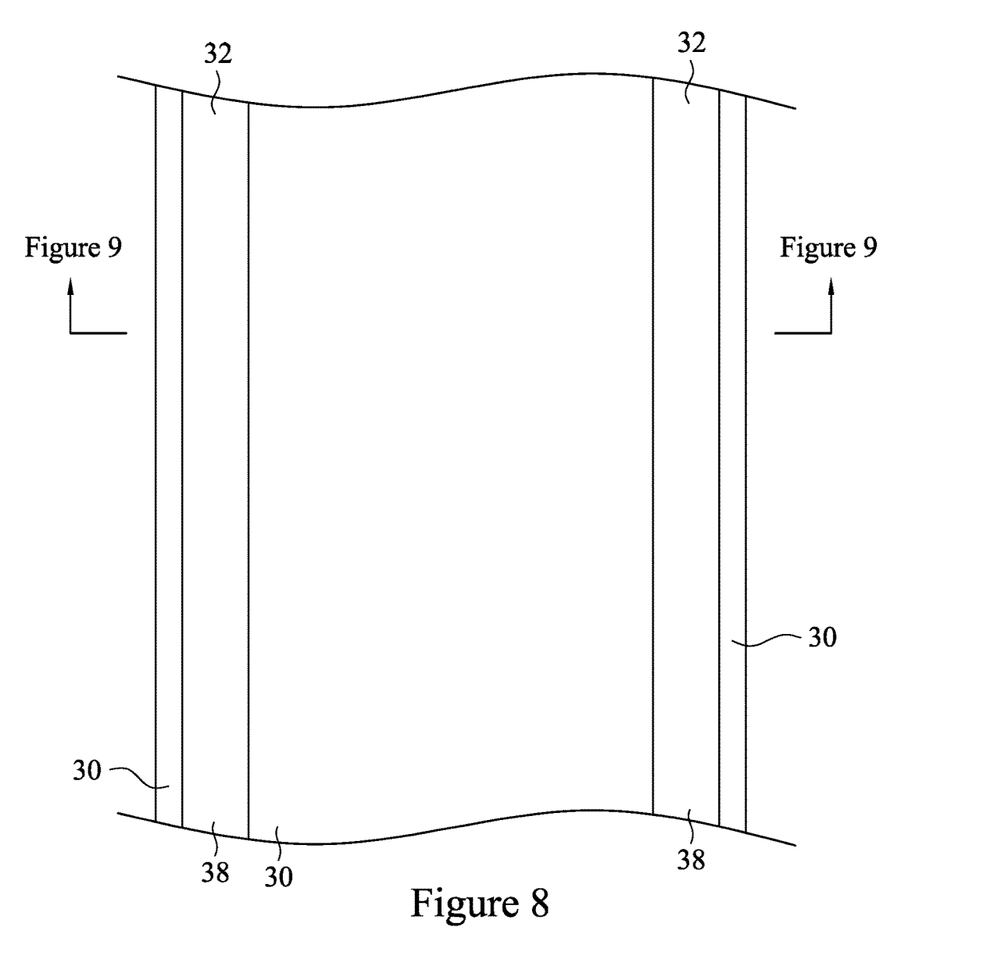
FIG. 8 is a top view of a cover layer secured to a support substrate containing semiconductor chips in accordance with some embodiments.
Figure 9:
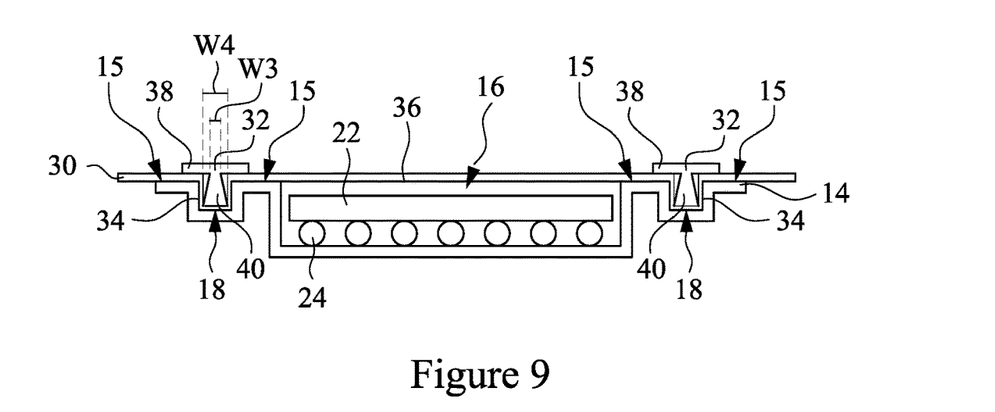
FIG. 9 is a cross-sectional view of a cover layer secured to a support substrate containing semiconductor chips, along the axis shown in FIG. 8 in accordance with some embodiments.

FIG. 8 is a top view of the cover layer 30 secured to the support substrate 14 containing semiconductor chips 22 in accordance with some embodiments. FIG. 9 is a cross-sectional view, of the cover layer 30 secured to the support substrate 14 containing the semiconductor chips 22, along the axis shown in FIG. 8 in accordance with some embodiments. It is beneficial to review FIGS. 8 and 9 together.

As the cover layer 30 is thin and flexible, portions 34 of the cover layer 30 are deformed within the channels 18 when the portions 34 are pushed into the channels 18 by the plugs 32. As a result, as best shown in FIG. 9, the portions 34 of the cover layer 30 are sandwiched between the plugs 32 and the support substrate 14.

When the cover layer 30 is secured to the support substrate 14, the semiconductor chips 22 are sealed within the receptacles 16. That is, the cover layer 30 covers the receptacles 16 in which the semiconductor chips 22 are located and retains the semiconductor chips 22 within the receptacles.

In one embodiment, the plugs 32 secure the cover layer 30 to the support substrate 14 such that the cover layer 30 is taut (i.e., without any slack). For example, as shown in FIG. 9, the cover layer 30 is held tightly by the plugs 32 such that a portion 36 of the cover layer 30 that directly overlies the receptacle 16 remains substantially planar. As the cover layer 30 is taut, the cover layer 30 does not unnecessarily increase the overall thickness of the chip holder 10, and the overall thickness of the carrier holder 10 may be minimized.

Similar to the support substrate 14 and the cover layer 30, in one embodiment, the plugs 32 extends for the entire length (i.e., the longest dimension) of the chip holder 10. Namely, the plugs 32 extend from a first end of the chip holder 10; along the length of the chip holder 10; and to a second end, opposite to the first end, of the chip holder 10. In other embodiments, plugs, 32 do not extend the entire length of the chip holder 10. For example, in other embodiments, cover layer 30 is held in place by a plurality of plugs 32 having a length that is less than the entire length of the chip holder that are inserted into each channel 18.

Using a non-adhesive layer for the cover layer 30 has many advantages. One advantage is that the thickness of the cover layer 30 is smaller than the thickness of current adhesive cover tapes. That is, because the cover layer 30 does not include an adhesive layer, the thickness of the cover layer 30 formed in accordance with embodiments described herein may be up to half the thickness of current adhesive cover tapes. As a result, the flexibility of the chip holder 10 may be improved, the overall thickness of the chip holder 10 may be reduced, and/or the amount of material used to fabricate the cover layer 30 may be reduced.

Another advantage of using a cover layer 30 free of adhesive, i.e., a non-adhesive layer, is that no adhesive is present which could cause semiconductor chips to stick to the cover layer 30. As previously discussed, some current tape and reel packing methods utilize an adhesive cover tape which is adhered to a carrier tape containing semiconductor chips within receptacles of the carrier tape. Consequently, the semiconductor chips will stick to the adhesive cover tape itself, and become damaged when attempting to remove the semiconductor chips from the adhesive cover tape or will be difficult to remove separate from the adhesive cover tape. In accordance with embodiments of the present disclosure, because the cover layer 30 is a non-adhesive layer (i.e., does not include any adhesive to stick the cover layer 30 to the support substrate 14), the semiconductor chips 22 are unable to stick to the cover layer 30 itself. Thus, utilization of a cover layer 30 in accordance with the present disclosure removes the possibility of the semiconductor chips 22 becoming damaged from sticking to the cover layer 30 and/or being difficult to separate from the cover layer 30.

An additional advantage of using a non-adhesive layer for the cover layer 30 is that the chip holder 10 may be reused. As previously discussed, carrier tapes and adhesive cover tapes for some current tape and reel packaging methods are not reusable because the carrier tape becomes damaged from the adhesive cover tape being removed from the carrier tape, and/or the adhesive cover tape loses its adhesive properties after a single use (i.e., stuck and removed from the carrier tape). Consequently, usage of such tape and reel packaging methods results in a one-time use of the carrier tape and the adhesive cover tape, and requires disposal of the used materials, both of which increase the costs of production. In accordance with embodiments described herein, the cover layer 30 is a non-adhesive layer (i.e., does not include an adhesive layer). As a result, the cover layer 30 will not damage the support substrate 14 when the cover layer 30 is removed from the support substrate 14. Further, the cover layer 30 does not rely on an adhesive layer maintaining its adhesive properties after multiple uses. Instead, the cover layer 30 may be secured to the support substrate 14 repeatedly with the plugs 32. Accordingly, the chip holder 10 may be reused multiple times. Thus, once the semiconductor chips 22 are delivered to their desired destination, the support substrate 14, the cover layer 30, and the plugs 32 may be saved and used to package additional semiconductor chips for another shipment. Thus, use of chip holder 10 in accordance with embodiments described herein results in very little, if any, wasted material and avoids the need for costly disposal of used chip holders.

In one embodiment, each of the plugs 32 has a "T" shaped cross-section. For example, as shown in FIGS. 8-9, each of the plugs 32 has a first portion 38 and a second portion 40.

In FIGS. 8-9, the first portion 38 of the plugs 32 extends in a first direction that is substantially parallel to the surfaces 15 of the support substrate 14 (i.e., in the horizontal direction in FIG. 9). The first portion 38 extends over a channel such that the first portion 38 contacts the surfaces 15 on opposite sides of the channel.

The second portion 40 of the plugs 32 extends in a second direction that is substantially perpendicular or transverse to the first direction (i.e., in the vertical direction in FIG. 9). The second portion 40 is inserted into the channels 18. In one embodiment, the second portion 40 transitions between two different widths. For example, as shown in FIG. 9, the second portion 40 transitions from a first width w3 to a second width w4 that is larger than the first width w3. The larger second width w4 ensures that the plugs 32 are held in place, for example, by friction, when inserted into the channels 18. Namely, the second width w4 is large enough such that the plugs 32 may not easily fall out of the channels 18 when inserted into the channels 18 with the cover layer 30.

Figure 10:
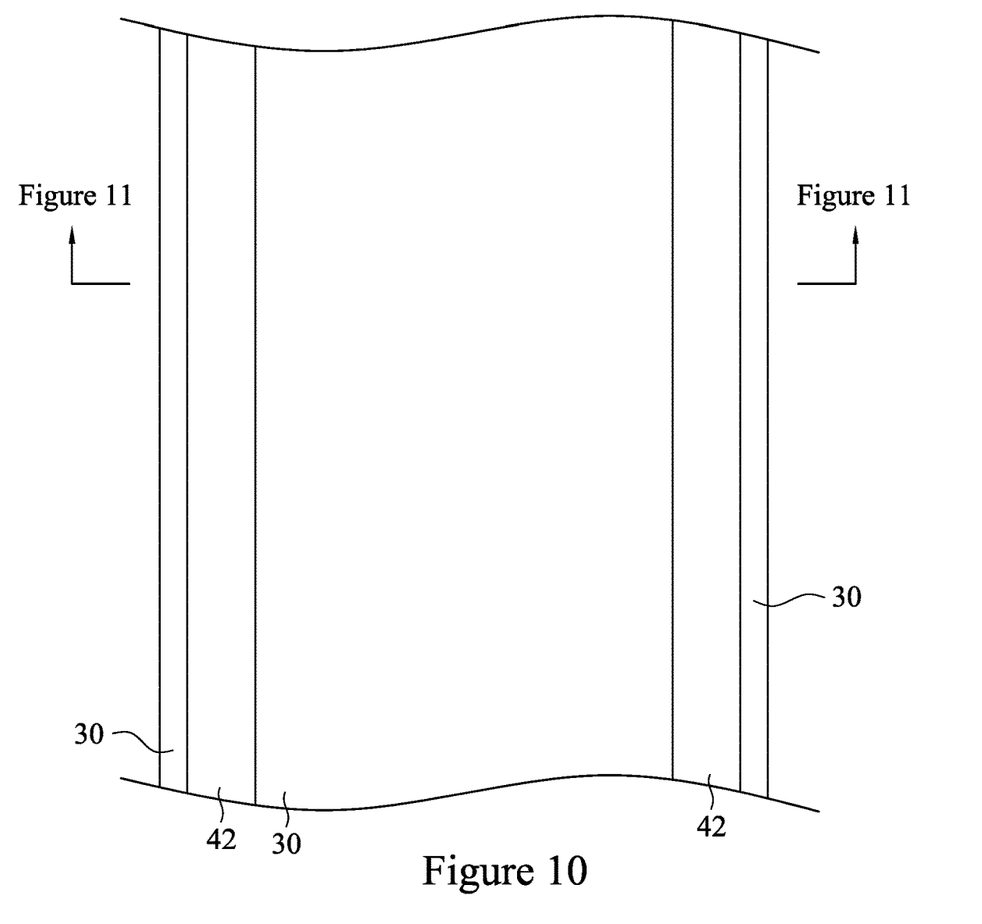
FIG. 10 is a top view of a cover layer secured to a support substrate containing semiconductor chips in accordance with some embodiments.
Figure 11:
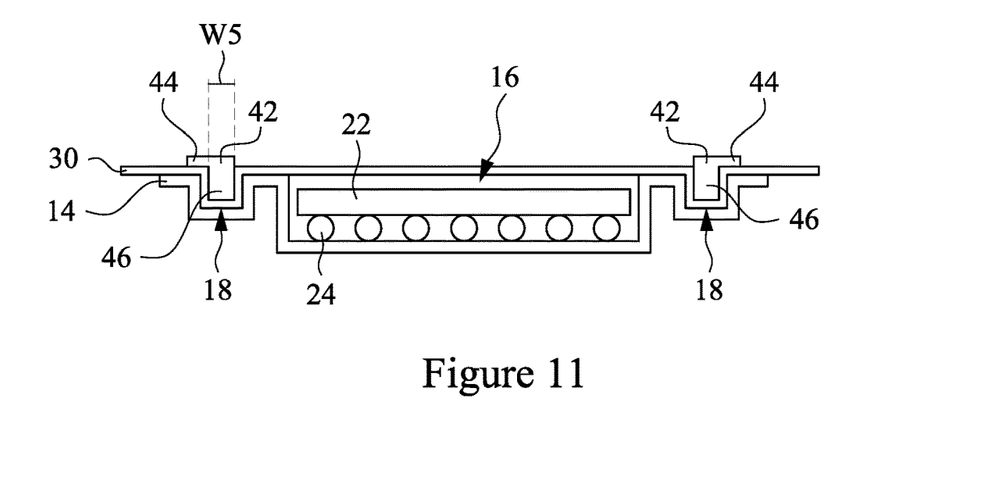
FIG. 11 is a cross-sectional view of a cover layer secured to a support substrate containing semiconductor chips, along the axis shown in FIG. 10 in accordance with some embodiments.

Other shapes are also possible for the plugs. FIG. 10 is a top view of the cover layer 30 secured to the support substrate 14 containing semiconductor chips 22 in accordance with some embodiments. FIG. 11 is a cross-sectional view of the cover layer 30 secured to a support substrate 14 containing semiconductor chips 22, along the axis shown in FIG. 10 in accordance with some embodiments. It is beneficial to review FIGS. 10 and 11 together.

In contrast to FIGS. 8 and 9, the cover layer 30 is secured to the support substrate 14 with plugs 42. Each of the plugs 42 has an "L" shaped cross-section. For example, as shown in FIGS. 10-11, each of the plugs 42 includes a first portion 44 and a second portion 46. As the plugs 42 have a smaller cross-section than the plugs 32, the plugs 42 may be fabricated with less material. Thus, fabrication costs may be reduced.

Similar to the first portion 38 of the plugs 32, the first portion 44 of the plugs 42 extends in a first direction that is substantially parallel to the surfaces 15 of the support substrate 14 (i.e., in the horizontal direction in FIG. 11). However, in contrast to the first portion 38 of the plugs 32, the first portion 38 extends over a channel such that the first portion 38 contacts the surfaces 15 on a single side of the channel. For example, as best shown in FIG. 11, the plugs 42 contact the surfaces 15 on the sides of the channels 18 furthest away from the receptacles 16. It noted that the plugs 42 may also contact the surfaces 15 on the sides of the channels 18 closest to the receptacles 16.

Similar to the second portion 40 of the plugs 32, the second portion 46 of the plugs 42 extends in a second direction that is substantially perpendicular or transverse to the first direction (i.e., in the vertical direction in FIG. 11). The second portion 46 is inserted into the channels 18. In one embodiment, the second portion 46 has a constant width. For example, as shown in FIG. 11, the second portion 46 has a width w5. In one embodiment, similar to the second portion 40 of the plugs 32, the second portion 46 transitions between two different widths. Namely, the second portion 46 transitions from a first width to a second width that is larger than the first width.

Figure 12:
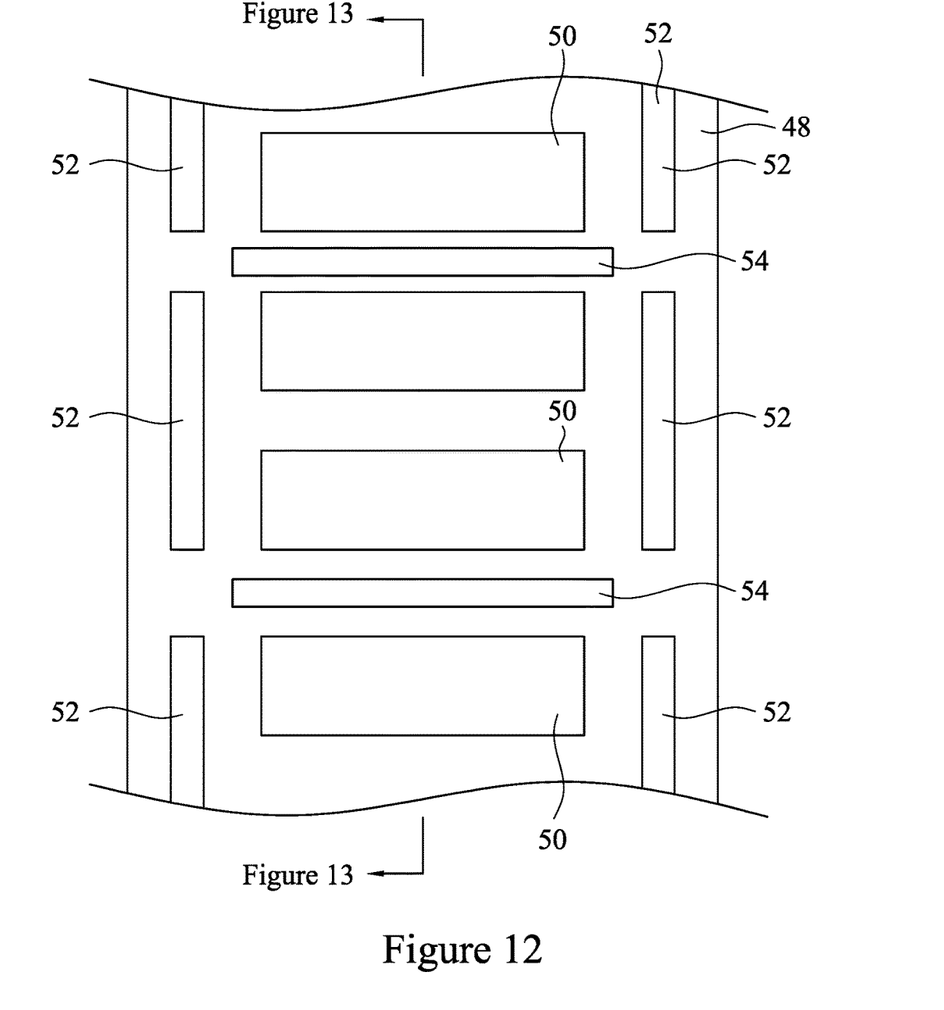
FIG. 12 is a top view of a support substrate in accordance with some embodiments.
Figure 13:
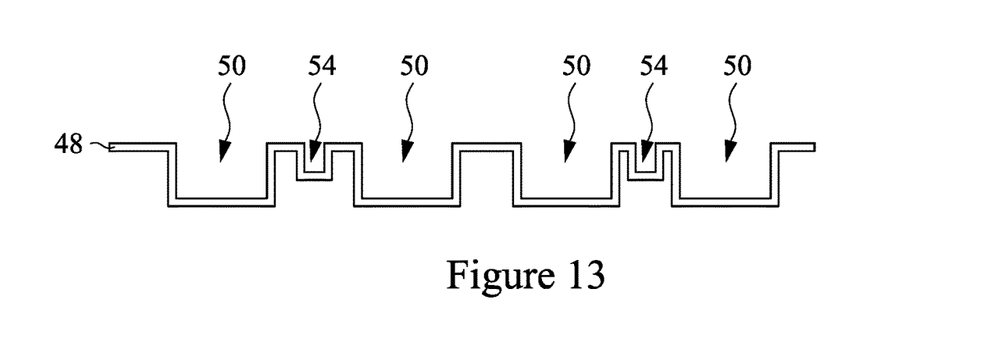
FIG. 13 is a cross-sectional view of a support substrate, along the axis shown in FIG. 12 in accordance with some embodiments.

The support substrate for the chip holder 10 may also have many different configurations. For example, the support substrate may include a plurality of channels (i.e., equal to or greater than two channels) that extend along the length and/or width of the support substrate 14. FIG. 12 is a top view of a support substrate 48 in accordance with some embodiments. FIG. 13 is a cross-sectional view of the support substrate 48, along the axis shown in FIG. 12 in accordance with some embodiments. It is beneficial to review FIGS. 12 and 13 together. It is noted that FIGS. 12 and 13 show just a portion of the support substrate 48.

The support substrate 48 is similar to the support substrate 14. Namely, the support substrate 48 includes receptacles 50 configured to receive and hold semiconductor chips; and channels 52, 54 are configured to receive plugs to secure a cover layer (e.g., the cover layer 30) to the support substrate 48.

In contrast to the support substrate 14, the support substrate 48 includes more than two channels, and the channels 52, 54 extend in different directions. In one embodiment, the support substrate 48 includes a plurality of channels that extend along the length (i.e., the longest dimension) of the support substrate 48, and a plurality of channels that extend along the width (i.e., the dimension perpendicular to the length) of the support substrate 48. For example, as best shown in FIG. 13, the channels 52 extend in a vertical direction (relative to the page) along the sides of the support substrate 14; and the channels 54 extend in a horizontal direction (relative to the page). The additional channels within the support substrate 48 allow additional plugs to be used to couple a cover layer to the support substrate 48. That is, in contrast to the support substrate 14 that uses two plugs to secure the cover layer 30, the support substrate 48 allows for more than two plugs to be used to couple a cover layer to the support substrate 48.

The various described embodiments provide a chip holder that holds semiconductor chips. The chip holder protects the semiconductor chips from possible damage during transport and/or storage. The chip holder is flexible and may be wound around a reel for convenient transport and/or storage. In one embodiment, the chip holder utilizes cover layer that does not include an adhesive layer and plugs to secure the cover layer to the support substrate with semiconductor chips in receptacles of the support substrate. As the cover layer does not include an adhesive layer, the cover layer may be fabricated to be thinner than current adhesive cover tapes. As a result, the flexibility of the chip holder may be improved; the overall thickness of the chip holder may be reduced; and the amount of material used to fabricate the cover layer, and thus the cost, may be reduced. In addition, without an adhesive layer, there is no material present which can adhere the semiconductor chips to the cover layer itself. Thus, use of cover layers formed in accordance with embodiments described herein removes the possibility of semiconductor chips becoming adhered to the cover layer and damaged when attempting to remove semiconductor chips stuck to the cover layer. Further, using the non-adhesive cover layer and the plugs to seal and hold semiconductor chips within the support substrate allows the chip holder to be reused multiple times. Accordingly, the chip holder results in very little, if any, wasted material and significant cost savings.

According to one embodiment disclosed herein, a semiconductor chip holder includes a substrate including a first elongated channel extending in a first direction, and a plurality of cavities aligned with each other in the first direction; a first elongated plug configured to be inserted into the first elongated channel; and a cover layer that separates the substrate from the first elongated plug when the first elongated plug is inserted into the first elongated channel.

According to one embodiment disclosed herein, a semiconductor chip holder includes a substrate including a first channel; a second channel; and a plurality of receptacles between the first channel from the second channel.

According to one embodiment disclosed herein, a method includes positioning chips in respective receptacles in a substrate; positioning a cover layer over the substrate; positioning a plug over the cover layer, the plug overlying a channel in the substrate; and pushing portions of the cover layer into the channel by inserting the plug into the channel.

It is noted that, although the present disclosure is discussed with respect to transporting and/or storing semiconductor chips, the chip holder 10 may be used for other types of components. For example, the chip holder 10 may be used to transport and/or store various mechanical and electrical components.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor chip holder, comprising:
    a substrate including:
        a first elongated channel extending in a first direction;
        a second elongated channel extending in a first direction, the first elongated channel and the second elongated channel being aligned with each other in a second direction transverse to the first direction; and
        a plurality of cavities aligned with each other in the first direction, the first elongated channel and the second elongated channel being positioned on opposite sides of the plurality of cavities;
    a cover layer configured to cover the first elongated channel and the plurality of cavities, and the second elongated channel;
    a first elongated plug configured to be inserted into the first elongated channel and push a first portion of the cover layer into the first elongated channel; and
    a second elongated plug configured to be inserted into the second elongated channel and push a second portion of the cover layer into the second elongated channel, the cover layer being secured to the substrate by the first elongated plug and the second elongated plug, the cover layer separating the substrate from the first elongated plug and the second elongated plug when the first elongated plug and the second elongated plug are inserted into the first elongated channel and the second elongated channel, respectively.

2. The semiconductor chip holder of claim 1 wherein the plurality of cavities have greater depths than each of the first elongated channel and the second elongated channel.

3. The semiconductor chip holder of claim 1 wherein the first elongated plug includes:
    a first portion that is on a surface of the substrate when the first elongated plug is inserted into the first elongated channel; and
    a second portion that extends into the first elongated channel when the first elongated plug is inserted into the first elongated channel.

4. The semiconductor chip holder of claim 3 wherein the second portion transitions from a first dimension to a second dimension that is larger than the first dimension, the first and second dimensions extending in the third direction.

5. The semiconductor chip holder of claim 1 wherein the substrate includes:
    a third elongated channel extending in the second direction; and
    a fourth elongated channel extending in the second direction.

6. The semiconductor chip holder of claim 1 wherein the substrate, the cover layer, the first elongated plug, and the second elongated plug are separate physical components.

7. A semiconductor chip holder, comprising:
    a substrate having a planar upper surface, the substrate including:
        a first channel extending into the planar upper surface and extending in a first direction;
        a second channel extending into the planar upper surface and extending in the first direction, the first channel and the second channel being aligned with each other in a second direction transverse to the first direction; and
        a plurality of receptacles extending into the planar upper surface, the plurality of receptacles being aligned with each other in the first direction, the plurality of receptacles being positioned between the first channel and the second channel,
    a cover layer configured to cover the first channel the second channel, and the plurality of receptacles:
    a first plug configured to be inserted into the first channel; and
    a second plug configured to be inserted into the second channel, the substrate being spaced from the first plug, and the second plug by the cover layer when the first plug and the second plug are inserted into the first channel and the second channel, respectively, each of the first plug and the second plug including a first portion that extends in the second direction, and a second portion that extends in a third direction that is transverse to the second direction.

8. The semiconductor chip holder of claim 7 wherein the first channel and the second channel extend the entire length of the substrate.

9. The semiconductor chip holder of claim 7 wherein the plurality of receptacles have greater depths than the first channel and the second channel.

10. The semiconductor chip holder of claim 7 wherein the second portion transitions between two different thicknesses.

11. The semiconductor chip holder of claim 7 wherein the substrate and the cover layer are plastic.

12. The semiconductor chip holder of claim 7 wherein the substrate and the cover layer are flexible.

13. A chip holder, comprising:
    a substrate;
    a first channel in the substrate and extending in a first direction;
    a second channel in the substrate and extending in the first direction;
    a plurality of third channels in the substrate and extending in a second direction transverse to the first direction;
    a plurality of receptacles in the substrate, the plurality of receptacles configured to receive chips, at least two adjacent receptacles of the plurality of receptacles being positioned between the first channel and the second channel and positioned between two third channels of the plurality of third channels, the at least two adjacent receptacles of the plurality of receptacles being separated from remaining receptacles of the plurality of receptacles by the two third channels of the plurality of third channels.

14. The chip holder of claim 13 wherein the plurality of receptacles have greater depths than each of the first channel, the second channel, and the plurality of third channels.

15. The chip holder of claim 13, further comprising:
a first plug configured to be inserted in the first channel;
a second plug configured to be inserted in the second channel;
a plurality of third plugs configured to be inserted in the plurality of third channels; and
a cover layer configured to be secured to the substrate by the first plug, the second plug, and the plurality of third plugs.

16. The chip holder of claim 13 wherein the plurality of third channels have smaller lengths than each of the first channel and the second channel.

17. The chip holder of claim 13 wherein the first channel and the second channel extend the entire length of the substrate.

18. The chip holder of claim 13, further comprising:
a plurality of a first channels that include the first channel, the plurality of first channels being aligned with each other and extending in the first direction; and
a plurality of second channels that include the second channel, the plurality of second channels being aligned with each other and extending in the first direction.

* * * * *

UNITED STATES PATENT AND TRADEMARK OFFICE
CERTIFICATE OF CORRECTION

PATENT NO. : 10,879,098 B2
APPLICATION NO. : 16/134448
DATED : December 29, 2020
INVENTOR(S) : Tsung-Jen Liao et al.

Page 1 of 1

It is certified that error appears in the above-identified patent and that said Letters Patent is hereby corrected as shown below:

In the Claims

Column 12, Line 31, Claim 7:
"the second channel," should read: --the second channel;--.

Column 12, Line 32, Claim 7:
"the first channel the" should read: --the first channel, the--.

Signed and Sealed this
Sixth Day of July, 2021

Drew Hirshfeld
*Performing the Functions and Duties of the
Under Secretary of Commerce for Intellectual Property and
Director of the United States Patent and Trademark Office*